United States Patent [19]

Nadd

[11] Patent Number: 5,761,020
[45] Date of Patent: Jun. 2, 1998

[54] FAST SWITCHING SMARTFET

[75] Inventor: Bruno C. Nadd, Puyvert, France

[73] Assignee: International Rectifier Corporation, El Segundo, Calif.

[21] Appl. No.: 781,700

[22] Filed: Jan. 10, 1997

[51] Int. Cl.[6] .................................................. H02H 5/04
[52] U.S. Cl. .................................... 361/103; 361/58
[58] Field of Search ......................... 361/18, 54, 56, 361/57, 58, 78, 79, 86, 87, 88, 89, 93, 94, 98, 99, 100, 101, 103

[56] References Cited

U.S. PATENT DOCUMENTS

| 4,910,631 | 3/1990 | Murphy | 361/96 |
|---|---|---|---|
| 5,424,892 | 6/1995 | Topp et al. | 361/18 |
| 5,497,285 | 3/1996 | Nadd | 361/103 |
| 5,550,701 | 8/1996 | Nadd et al. | 361/103 |
| 5,555,152 | 9/1996 | Brauchle et al. | 361/103 |

*Primary Examiner*—Ronald W. Leja
*Attorney, Agent, or Firm*—Ostrolenk, Faber, Gerb & Soffen, LLP

[57] ABSTRACT

In a power integrated device having temperature monitoring circuits powered from input signal pulses, an overtemperature signal is memorized in a small capacitor (30 picofarads) to guarantee that the overtemperature signal will not be lost between two input pulses at a frequency greater than about 16 kHz. A larger charge storage capacitor (100 picofarads) is also added to store the input voltage $V_{cc}$ needed to power the overtemperature circuits.

13 Claims, 1 Drawing Sheet

FAST SWITCHING SMARTFET

This application claims the benefit of U.S. Provisional Application Ser. No. 60/010,760, filed Jan. 29, 1996.

FIELD OF THE INVENTION

This invention relates to power integrated circuits, and more specifically relates to a very fast power MOSFET with an integrated thermal shutdown circuit which operates at high speed.

BACKGROUND OF THE INVENTION

MOSgated power devices, such as IGBTs and power MOSFETs having integrated current and thermal monitoring circuits to turn off the power device under certain fault conditions are well known. The power supply for such power integrated devices is derived from the input signal pulse. When the device speed is increased, the power supply or $V_{cc}$ pulse lasts, for example, for only 100 nanoseconds for a 25 kHz application. However, the temperature monitoring circuit, for example, requires about 5 microseconds to complete its calculation. Since $V_{cc}$ power is available only for 100 nanoseconds, the temperature sensing circuit would lose its power supply and would misfunction if the system is operated at about 25 kHz or higher.

BRIEF DESCRIPTION OF THE INVENTION

In accordance with the invention, the temperature monitoring circuit of a power integrated MoSgated device, for example, the temperature monitor circuit in the IR6012 device made by the International Rectifier Corporation of El Segundo, Calif., is modified to store or memorize the last temperature calculation when $V_{cc}$ disappears. Thus, the overtemperature signal is memorized in a small capacitor to guarantee that the overtemperature signal will not be lost between two pulses at a frequency greater than about 16 kHz (a period of about 60 microseconds). A charge storage capacitor is also added to store the input voltage $V_{cc}$ after the pulse terminates. For example, a 100 picofarad capacitor is integrated into the silicon chip, and takes only about 0.15 mm$^2$ in area.

The capacitor used to store the overtemperature signal may be about 30 picofarads. The 100 picofarad capacitor is sufficiently large to supply the power to the overtemperature circuit, and is also large enough to charge the 30 picofarad capacitor.

The values given above can be varied as desired but the capacitor charged from $V_{cc}$ is preferably larger than the capacitor which stores the overtemperature signal and must be large enough to "refresh" the overtemperature signal at each $V_{cc}$ cycle.

DETAILED DESCRIPTION OF THE INVENTION

Figure 1:
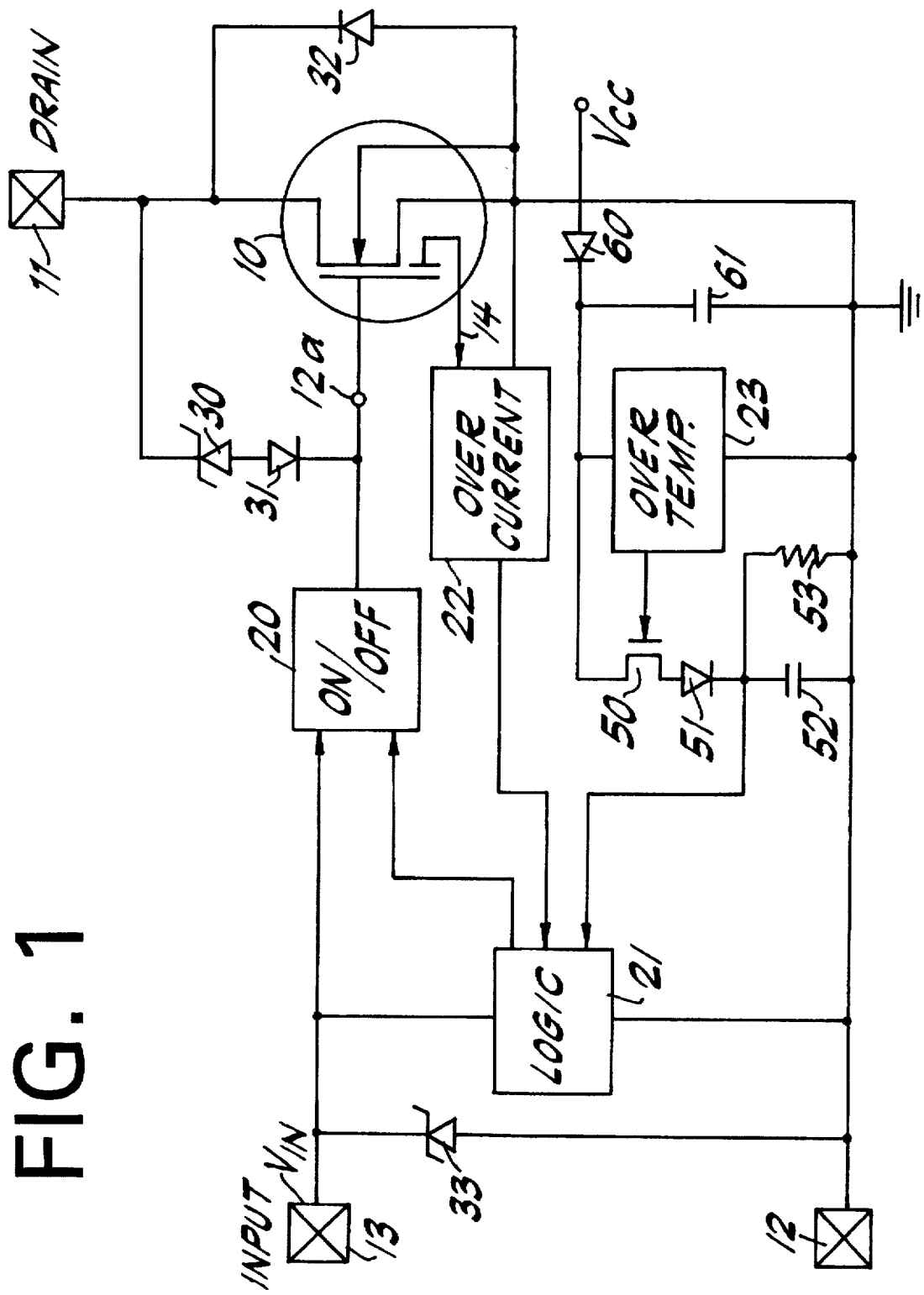
FIG. 1 shows a partial block and partial circuit diagram of the present invention.

FIG. 1 shows the novel circuit of the invention when applied to a power MOSFET having circuits integrated with the power chip to provide overtemperature and overcurrent protection. The prior art circuit is described in more detail in copending U.S. Ser. No. 08/298,383, filed Aug. 30, 1994 now U.S. Pat. No. 5,550,701, issued Aug. 27, 1996, entitled POWER MOSFET WITH OVERCURRENT AND OVERTEMPERATURE PROTECTION AND CONTROL CIRCUIT DECOUPLED FROM BODY DIODE, and in the names of Bruno C. Nadd and Talbott M. Houk, the subject of which is incorporated herein by reference.

Thus in the prior power integrated circuit, there is provided a power MOSFET 10 conventionally formed in a silicon chip. Other MOSgated power devices could be used. Power MOSFET 10 comprises a die having a drain electrode 11, a source electrode 12, a gate electrode 12a and a conventional current sense electrode 14. The die may be housed in a housing having connection pins extending therefrom. The input pin 13 of the device is connected to a logic level source which, for example, swings between 0 and 5 volts at the desired frequency of operation of the power MOSFET 10. The input pin 13 is connected to the gate 12a through an on/off switching circuit 20. Circuit 20 is turned off to turn off MOSFET 10 in the presence of predetermined conditions, such as an overcurrent, as measured by overcurrent monitor circuit 22 or overtemperature, as measured by temperature monitor circuit 23. The monitor circuits are preferably integrated into the same die or chip which contains the junctions of MOSFET 10.

The overcurrent circuit 22 receives a current measurement input from current sense terminal 14 and delivers an output to logic circuit 21 which opens switching circuit 20 if a current fault is monitored.

Overtemperature circuit 23 is powered from the $V_{cc}$ pulses which may be derived from input pin 13. A suitable circuit produces an overtemperature output which, in the prior art, was connected to an input in logic circuit 21 so that the switching circuit can be turned off in the presence of the predetermined overtemperature condition.

The prior art circuit was also provided with zener diode 30 and diode 31 connected between the gate and drain electrodes of MOSFET 10 and a diode 32 connected as shown.

In accordance with the invention, the prior art thermal shutdown circuit 23 is modified by adding a MOSFET 50, diode 51, capacitor 52 and resistor 53. The $V_{cc}$ input, derived from input pin 13 and which powers the overtemperature circuit, has added thereto the diode 60 and capacitor 61. Both diodes 51 and 60 are preferably polysilicon diodes integrated on the same silicon chip as contains the junctions of power MOSFET 10.

The "settle time" for the overtemperature circuit 23 is about 0.5 microseconds. However, the overtemperature output signal can be lost between two pulses of operating power ($V_{cc}$) at frequencies greater than about 16 kHz. The addition of diode 51, capacitor 52 and resistor 53 ensures that the overtemperature calculation is not lost by virtue of a sufficiently long R-C time constant. Thus, if capacitor 52 is 30 picofarads (0.05 mm$^2$ in area on the chip) and resistor 53 is 10 megohms, the time constant will be about 300 microseconds. Other time constants can be used.

It will be observed that the circuit will now operate properly only if $V_{IN}$ or $V_{cc}$ is present for at least one microsecond each cycle. To protect the device for low duty cycles, the filter capacitor 61 and diode 60 are added to the $V_{cc}$ input circuit to the overtemperature monitor 23. Capacitor 61 is preferably 100 picofarads to be able to supply the overtemperature circuit 23 for several microseconds and to charge the 30 picofarad capacitor 52.

Thus, in a circuit configuration in which the $V_{cc}$ is only a 100 nanosecond pulse at, for example, 20 kHz, the filtered $V_{cc}$ is on long enough to refresh the overtemperature signal each cycle.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated power integrated circuit device comprising: a MOSgated power device having output electrodes and an input gate electrode; an input signal circuit for supplying a high frequency signal to said gate electrode to turn said power device on and off at high frequency; an overtemperature monitor circuit for monitoring the temperature of said power device and for producing an output signal operable to disconnect said input signal circuit from said input gate electrode when the temperature monitored exceeds a predetermined value; said overtemperature monitor circuit having a terminal connected to a source of voltage $V_{cc}$ for powering said overtemperature monitor circuit; said source of voltage $V_{cc}$ being derived from said input signal circuit; and at least a first capacitor circuit coupled to said overtemperature monitor circuit for storing the output signal of said overtemperature monitor circuit between pulses of the voltage $V_{cc}$ to prevent loss of said output signal between said $V_{cc}$ pulses.

2. The device of claim 1 which further includes a second capacitor circuit coupled to said terminal connected to said voltage source $V_{cc}$ to ensure that the overtemperature monitor circuit will be powered on for a time longer than its settle time.

3. The device of claim 1 wherein said high frequency signal at said input signal circuit has a frequency in excess of about 16 kHz.

4. The device of claim 1 wherein said MOSgated device is a power MOSFET.

5. The device of claim 1 wherein said at least first capacitor circuit includes a diode and a control MOSFET in series with a first capacitor and a resistor in series with said terminal connected to said input voltage $V_{cc}$.

6. The device of claim 2 wherein said high frequency signal at said input signal circuit has a frequency in excess of about 16 kHz.

7. The device of claim 6 wherein said second capacitor circuit includes a diode and a second capacitor in series with said terminal connected to said input voltage $V_{cc}$.

8. The device of claim 7 wherein said second capacitor has a value of about 100 picofarads.

9. The device of claim 2 wherein said second capacitor circuit includes a diode and a second capacitor in series with said terminal connected to said input voltage $V_{cc}$.

10. The device of claim 2 wherein said first capacitor circuit comprises a diode and a control MOSFET in series with a first capacitor and a resistor in series with said terminal connected to said input voltage $V_{cc}$.

11. The device of claim 10 wherein said first capacitor has a value of about 30 picofarads.

12. The device of claim 3 wherein said first capacitor circuit includes a diode and a control MOSFET in series with a first capacitor and a resistor in series with said terminal connected to said input voltage $V_{cc}$.

13. The device of claim 12 wherein said first capacitor has a value of about 30 picofarads.

\* \* \* \* \*